US011526062B2

(12) United States Patent
Asai et al.

(10) Patent No.: US 11,526,062 B2
(45) Date of Patent: Dec. 13, 2022

(54) DISPLAY DEVICE

(71) Applicant: Sharp Kabushiki Kaisha, Sakai (JP)

(72) Inventors: Yoshihiro Asai, Sakai (JP); Isao Ogasawara, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 17/712,269

(22) Filed: Apr. 4, 2022

(65) Prior Publication Data

US 2022/0326561 A1  Oct. 13, 2022

(30) Foreign Application Priority Data

Apr. 7, 2021 (JP) .............. JP2021-065261

(51) Int. Cl.
| | |
|---|---|
| G02F 1/1362 | (2006.01) |
| G02F 1/1345 | (2006.01) |
| G02F 1/1368 | (2006.01) |
| G09G 3/36 | (2006.01) |
| H01L 27/12 | (2006.01) |

(52) U.S. Cl.
CPC ...... *G02F 1/13629* (2021.01); *G02F 1/13452* (2013.01); *G09G 3/3674* (2013.01); *G09G 3/3685* (2013.01); *G02F 1/1368* (2013.01); *G02F 1/13454* (2013.01); *G02F 1/13456* (2021.01); *G09G 2320/0233* (2013.01); *G09G 2330/021* (2013.01); *H01L 27/124* (2013.01)

(58) Field of Classification Search
CPC ............. G02F 1/13452; G02F 1/13456; G02F 1/13454
See application file for complete search history.

(56) References Cited

U.S. PATENT DOCUMENTS

| | | |
|---|---|---|
| 2003/0063080 A1 | 4/2003 | Takahashi et al. |
| 2005/0200797 A1 | 9/2005 | Shiota et al. |
| 2006/0203138 A1* | 9/2006 | Chen .......... G09G 3/3611 349/39 |
| 2013/0265513 A1 | 10/2013 | Ogasawara et al. |
| 2019/0027090 A1* | 1/2019 | Nonaka ............ G09G 3/3225 |
| 2019/0319046 A1 | 10/2019 | Tominaga et al. |

FOREIGN PATENT DOCUMENTS

| | | |
|---|---|---|
| JP | 2003-108021 A | 4/2003 |
| JP | 2005-301239 A | 10/2005 |
| JP | 2019-184938 A | 10/2019 |
| WO | 2012/090817 A1 | 7/2012 |

* cited by examiner

*Primary Examiner* — Alexander P Gross
(74) *Attorney, Agent, or Firm* — Keating & Bennett, LLP

(57) ABSTRACT

A display device includes a display substrate, a plurality of source drive circuit elements, gate drive circuits, and a plurality of gate connection lines. The plurality of gate connection lines pass through inter-element regions between the source drive circuit elements in plan view, and pass through mounting regions. Gate terminals connected to the gate connection lines are formed at positions facing the inter-element regions in a direction from the inter-element regions toward an FPC (Y2 direction).

12 Claims, 14 Drawing Sheets

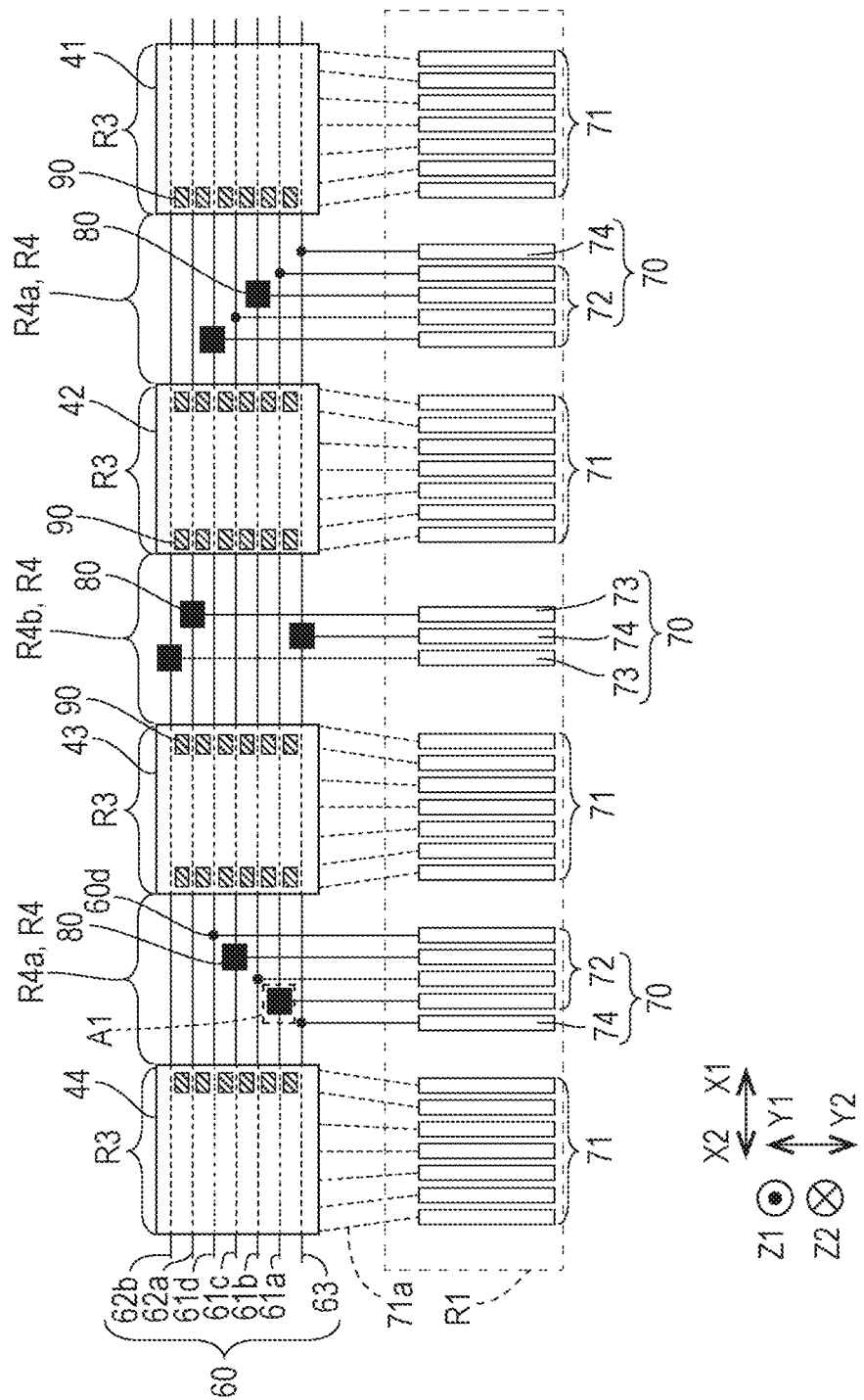

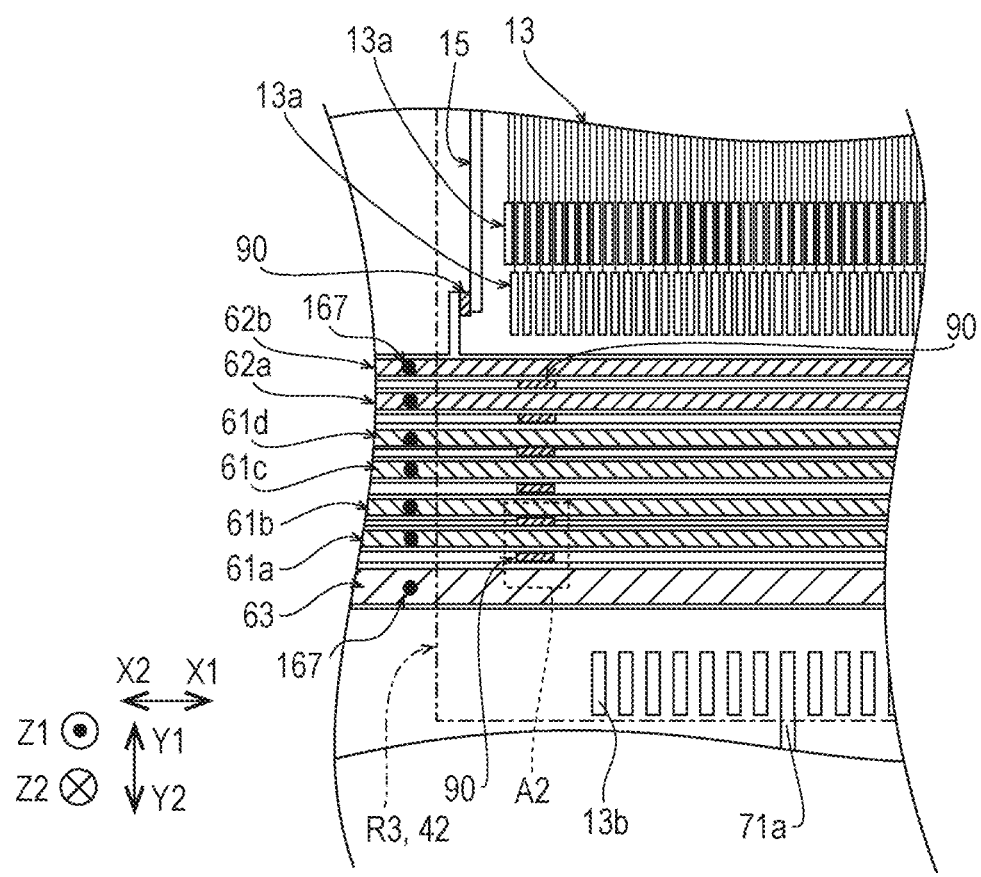

DISPLAY DEVICE

BACKGROUND

1. Field

The present disclosure relates to a display device.

2. Description of the Related Art

In the related art, there is known a display device in which control signals are exchanged between a circuit on a flexible printed circuit board and a display substrate. Such a display device is disclosed in Japanese Unexamined Patent Application Publication No. 2003-108021, for example.

The display device according to Japanese Unexamined Patent Application Publication No. 2003-108021 includes two gate drivers that are mounted on a display substrate, a drain driver that is rectangular in plan view and is mounted on the display substrate, a power supply formed on a flexible printed circuit board, and control signals lines. The control signal lines include a portion that connects an output terminal provided on one side of the rectangular drain driver and one of the two gate drivers, and a portion that passes beneath a chip forming the drain driver from this output terminal, and that extends from another side of the drain driver and is connected to the power supply. In this display device, common control signals are supplied from a controller within the drain driver to each of the gate driver and the power supply via the control signal lines.

Now, in an arrangement in which control signals are supplied to each of the gate drivers (gate drive circuits) and the drain driver (source drive circuit element) on the display substrate from the flexible printed circuit board, the size of a portion connecting the display substrate and the flexible printed circuit board (region in which terminals are disposed) is large, and the width of the flexible printed circuit board is large. Particularly, in arrangements in which a plurality of source drive circuit elements are provided on the display substrate, the width of the flexible printed circuit board is markedly large.

Accordingly, it is desirable to provide a display device in which the width of a flexible printed circuit board can be made to be small even in arrangements in which control signals are supplied to gate drive circuits and a plurality of source drive circuit elements on a display substrate, from the flexible printed circuit board.

SUMMARY

According to a first aspect of the disclosure, there is provided a display device including a display substrate that has a display region in which a plurality of thin-film transistors are formed; a plurality of terminals that are formed on the display substrate and that are connected to a flexible printed circuit board; a plurality of source drive circuit elements that are mounted on the display substrate, that supply source signals to the plurality of thin-film transistors, and that are, at least in part, disposed between the display region and the plurality of terminals in plan view; a first gate drive circuit that is formed on the display substrate, and that supplies a gate signal to at least one of the plurality of thin-film transistors; and a plurality of connection lines that connect the plurality of terminals and the first gate drive circuit. At least one of the plurality of connection lines passes through an inter-element region that is a region between at least two of the plurality of source drive circuit elements in the display substrate in plan view, and at least one of the plurality of connection lines passes through a mounting region in which one of the plurality of source drive circuit elements is disposed on the display substrate. Of the plurality of terminals, a terminal connected to the connection line passing through the inter-element region is formed at a position facing the inter-element region in a direction from the inter-element region toward the flexible printed circuit board.

BRIEF DESCRIPTION OF THE DRAWINGS

FIG. 2 is a plan schematic view for describing a layout relation between source drive circuit elements, connection lines, and terminals, according to the first embodiment;

FIG. 3 is a diagram for describing a configuration of a mounting region of a display substrate;

DESCRIPTION OF THE EMBODIMENTS

Figure 1A:
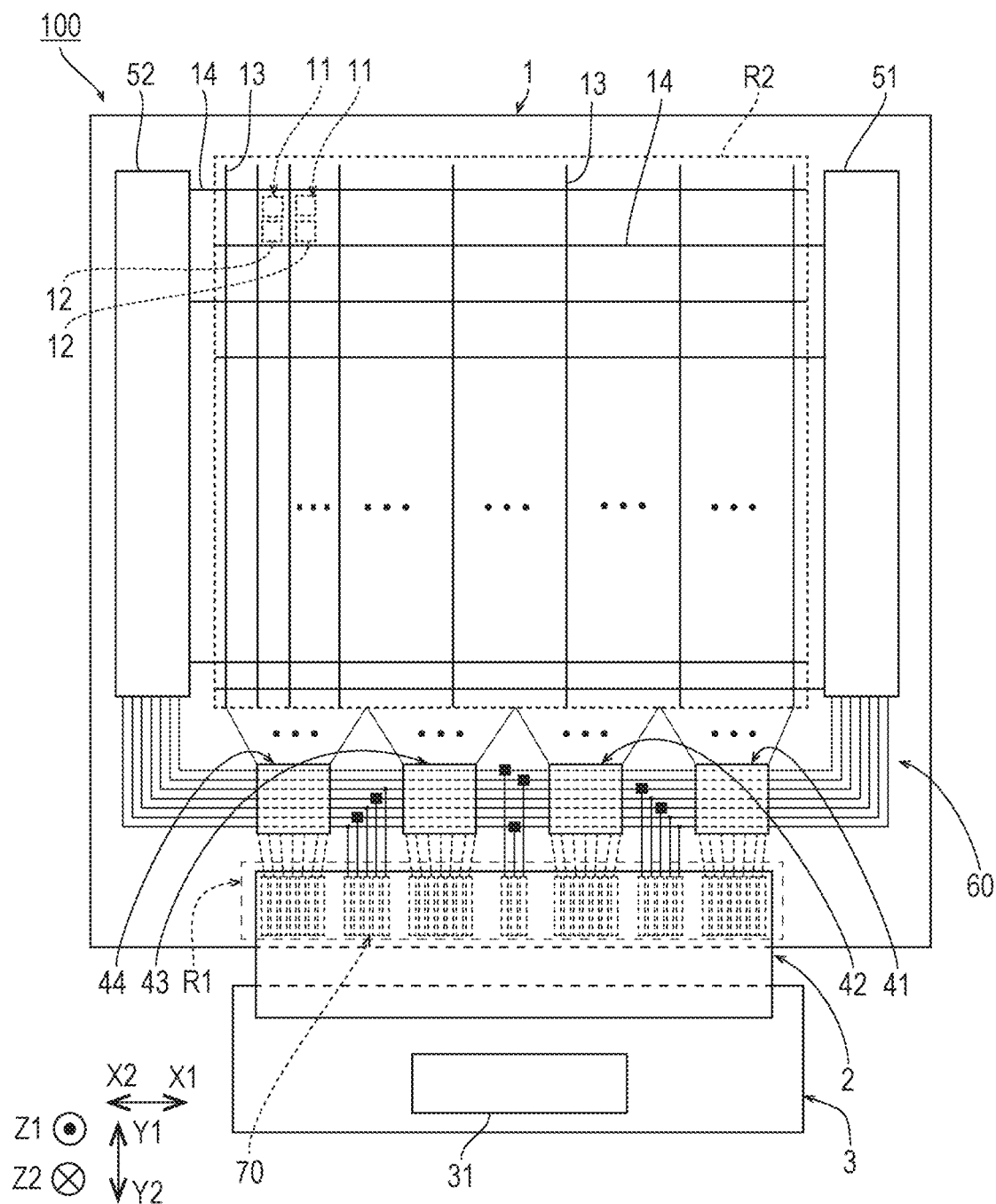
FIG. 1A is a plan schematic view illustrating a configuration of a display device according to a first embodiment.

Embodiments of the present disclosure will be described in detail below, with reference to the drawings. The same or equivalent portions in the drawings are denoted by the same reference symbols, and description thereof will not be repeated. Note that in the drawings referenced below, configurations may be illustrated in a simplified or schematized manner, and some components may be omitted, to facilitate description. Also, the dimensional ratios between components illustrated in the drawings may not necessarily be to actual scale.

First Embodiment

Overall Configuration of Display Device

A configuration of a display device 100 according to a first embodiment will be described with reference to FIG. 1A.

Figure 1B:
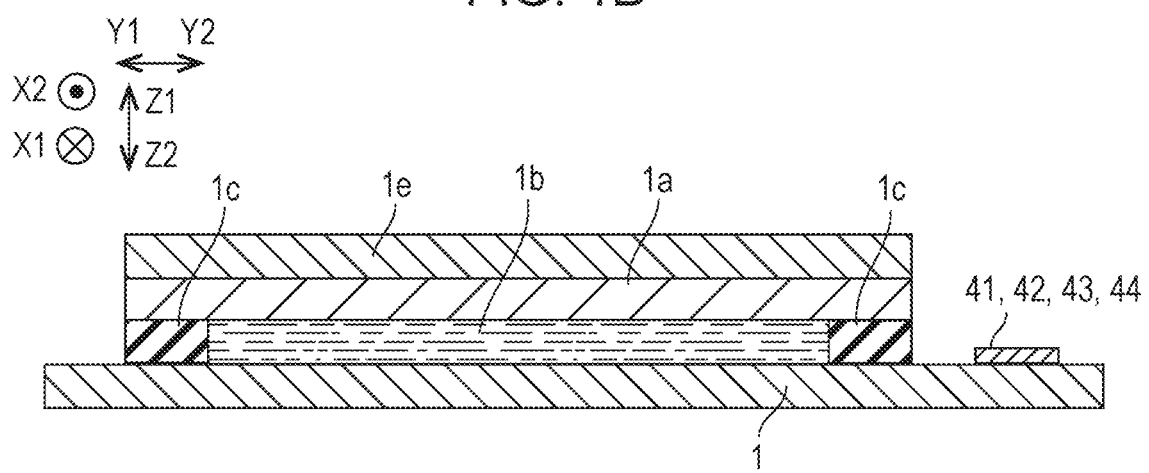
FIG. 1B is a cross-sectional schematic view, taken along a YZ plane, of part of the display device.
Figure 1C:
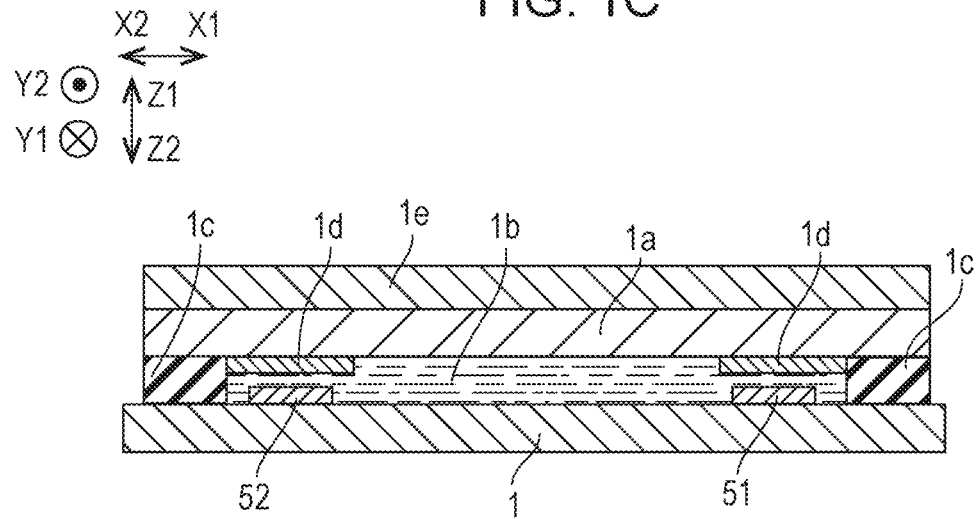
FIG. 1C is a cross-sectional schematic view, taken along an XZ plane, of part of the display device.

FIG. 1A is a plan schematic view illustrating the configuration of the display device 100 according to the first embodiment. Also, FIG. 1B is a cross-sectional view, taken along a YZ plane, of a part of the display device 100 where a display substrate 1 is provided. FIG. 1C is a cross-sectional view, taken along an XZ plane, of the part of the display device 100 where the display substrate 1 is provided. FIG. 2 is a plan schematic view for describing a layout relation between source drive circuit elements 41 to 44, gate connection lines 60, and gate terminals 70.

As illustrated in FIG. 1A, the display device 100 includes the display substrate 1, a flexible printed circuit board 2 (hereinafter referred to as "FPC 2"), a printed wiring board 3 (hereinafter referred to as "PWB 3"), and the source drive circuit elements 41, 42, 43, and 44. The display substrate 1 also includes gate drive circuits 51 and 52, and the plurality of gate connection lines 60. As illustrated in FIG. 2, the plurality of gate terminals 70, a plurality of source terminals 71, and a plurality of source control signal lines 71a may be formed on the display substrate 1. The plurality of gate connection lines 60 may be lines that connect the gate drive circuits 51 and 52, and the plurality of gate terminals 70. The plurality of source control signal lines 71a may be lines that connect the source drive circuit elements 41 to 44 and the plurality of source terminals 71.

As illustrated in FIG. 1A, a control circuit element 31 is mounted on the PWB 3. The control circuit element 31 includes an integrated circuit, for example. The control circuit element 31 transmits source control signals to the source drive circuit elements 41 to 44, and also transmits gate control signals to the gate drive circuits 51 and 52, via the FPC 2. The source drive circuit elements 41 to 44 generate source signals on the basis of the source control signals, and supply the source signals to source lines 13. The gate drive circuits 51 and 52 generate gate signals G on the basis of the gate control signals, and supply the gate signals to gate lines 14.

The FPC 2 electrically connects the control circuit element 31 of the PWB 3 and each of the plurality of gate terminals 70 and the plurality of source terminals 71 of the display substrate 1. A region in which the plurality of gate terminals 70 and the plurality of source terminals 71 are disposed will be referred to here as "terminal region R1". The terminal region R1 is provided in a Y2-direction frame portion of the display substrate 1. The FPC 2 is fixed to the terminal region R1. Wiring, which is not illustrated, is formed within the FPC 2, and gate control signals from the control circuit element 31 are transmitted to the plurality of gate terminals 70, and source control signals are transmitted to the plurality of source terminals 71, via this wiring.

As illustrated in FIG. 1B, the display device 100 may have the display substrate 1, a counter substrate 1a that faces the display substrate 1, and a medium layer that is sealed between the substrates and that contains a substance of which the optical properties change in accordance with application of an electric field (liquid crystal layer 1b containing liquid crystal molecules). The liquid crystal layer 1b is surrounded and sealed by a seal portion 1c interposed between the substrates. The counter substrate 1a faces at least a later-described display region R2 of the display substrate 1, and the source drive circuit elements 41, 42, 43, and 44 (see FIG. 1A) are mounted on a portion of the display substrate 1 that does not face the counter substrate 1a. Also, as illustrated in FIG. 1C, a light shielding film 1d is provided on the surface of the counter substrate 1a on the liquid crystal layer 1b side, with the gate drive circuits 51 and 52 being disposed so as to overlap this light shielding film 1d in plan view. The display device 100 may also include a backlight 1e that emits light toward the display region R2. The backlight 1e may be disposed further in a Z1 direction than the display substrate 1 and the counter substrate 1a in the first embodiment. In other words, the backlight 1e may be disposed on a side closer to the liquid crystal layer 1b and the counter substrate 1a than the display substrate 1.

Configuration of Display Substrate

Display Region

As illustrated in FIG. 1A, a plurality of pixel electrodes 11 and a plurality of thin-film transistors 12 are formed on the surface of the display substrate 1 on the liquid crystal layer 1b (see FIG. 1B) side. The region of the display substrate 1 in which the plurality of pixel electrodes 11 and the plurality of thin-film transistors 12 are formed is the display region R2. Note that while the display region R2 is illustrated as having a rectangular shape in plan view in FIG. 1A, the display region R2 may be formed with a circular shape, for example, or may be formed with a polygonal shape other than a rectangle.

Source Drive Circuit Element and Terminal Region

As illustrated in FIG. 2, the source drive circuit elements 41 to 44 are each configured as an integrated circuit chip, and are each mounted on the display substrate 1. The source drive circuit elements 41 to 44 are arrayed at intervals in that order in an X2 direction. Regions of the display substrate 1 that overlap the source drive circuit elements 41 to 44 in plan view (regions where the source drive circuit elements 41 to 44 are mounted) are each referred to as "mounting region R3". Also, regions of the display substrate 1 between the source drive circuit elements 41 to 44 in plan view are each referred to as "inter-element region R4". The inter-element regions R4 may include inter-element regions R4a and an inter-element region R4b, with the inter-element regions R4a being disposed at a position closer to the gate drive circuit 51 in an X1 direction than the inter-element region R4b and a position closer to the gate drive circuit 52 in the X2 direction than the inter-element region R4b.

Also, as illustrated in FIG. 2, the plurality of source terminals 71 to which the source control signal lines 71a are respectively connected are disposed in the terminal region R1 of the display substrate 1. The plurality of source control signal lines 71a are connected to each of the source drive circuit elements 41 to 44, and are formed so as to extend in the Y2 direction from each of the source drive circuit elements 41 to 44. Also, the plurality of source terminals 71 are formed at positions in the terminal region R1 facing the respective source drive circuit elements 41 to 44 (mounting regions R3) in the Y2 direction. In other words, the plurality of source terminal 71 may be formed at positions facing the mounting regions R3 in the direction from the mounting regions R3 toward the FPC 2 (Y2 direction). According to this configuration, the plurality of source terminals 71 are disposed at the positions facing the mounting regions R3, and accordingly variation in length of the source control signal lines 71a connecting the plurality of source terminals 71 and the source drive circuit elements 41 to 44 can be reduced. As a result, difference in waveforms of signal rounding of the source control signals can be reduced, and accordingly display unevenness due to difference in waveforms of signal rounding can be reduced.

FIG. 3 is a diagram for describing the configuration of the mounting region R3 on the display substrate 1. The source drive circuit element 42 is mounted on terminals 13a and 13b formed within the mounting region R3. The source drive circuit elements 41, 43, and 44 are also mounted on terminals 13a and 13b formed within the mounting regions R3, although not illustrated. The source drive circuit elements 41 to 44 are each further connected to the source lines 13 via the terminals 13a, and connected to the source control signal lines 71a via the terminals 13b. The source drive circuit elements 41 to 44 each acquire source control signals from the terminals 13b, and supply source signals to the source lines 13. The source drive circuit elements 41 and 44 also supply common control signals for driving a common electrode that is not illustrated, to common wiring 15. Thus, no intersection portion is formed between the common wiring 15 and the gate connection lines 60, and load (parasitic capacitance) of the gate connection lines 60 supplying gate control signals can be reduced. Accordingly, electric power consumption is reduced, and display defects due to signal rounding can be suppressed.

As illustrated in FIG. 2, the plurality of gate terminals 70 are provided in the terminal region R1. The plurality of gate terminals 70 may include a plurality of clock terminals 72, a plurality of start pulse terminals 73, and a plurality of low-potential terminals 74. Now, the gate control signals include clock signals CK1A, CK1B, CK2A, and CK2B, start pulse signals SPA and SPB, and a low-potential signal VSS. The clock signals CK1A, CK1B, CK2A, and CK2B are signals relating to rise and fall (on/off potential) of the gate signals G. The start pulse signals SPA and SPB are signals for starting driving of a later-described unit circuit 51a. The low-potential signal VSS is a signal for supplying an off potential in the gate lines 14 and the gate drive circuits 51 and 52. Also, the plurality of gate connection lines 60 may include clock lines 61a, 61b, 61c, and 61d, start pulse lines 62a and 62b, and a low-potential line 63. Note that the numbers and types of gate connection lines 60 are not limited to the above. That is to say, the number of clock lines may be less than four, or five or more, and the number of start pulse lines may be one or three or more. Also, a plurality of low-potential lines 63 may be provided.

The clock terminals 72 are connected to one of the clock lines 61a to 61d. The clock terminals 72 supply the clock signals CK1A, CK1B, CK2A, and CK2B to the respective clock lines 61a, 61b, 61c, and 61d. Also, the start pulse terminals 73 are connected to the start pulse lines 62a or 62b. The start pulse terminals 73 supply the start pulse signals SPA and SPB to the respective start pulse lines 62a and 62b. The low-potential terminals 74 are connected to the low-potential line 63. The low-potential terminals 74 supply the low-potential signal VSS to the low-potential line 63. Also, the plurality of clock terminals 72 are formed at positions in the terminal region R1 facing the inter-element regions R4a in the Y2 direction. Also, the plurality of start pulse terminals 73 are formed at positions in the terminal region R1 facing the inter-element regions R4b in the Y2 direction. In other words, the plurality of gate terminals 70 may be formed at positions facing the inter-element regions R4a or R4b in the direction toward the FPC 2 from the inter-element regions R4a or R4b (Y2 direction).

Now, the start pulse lines 62a and 62b are lines that each supply control signals to only one unit circuit 51a included in the gate drive circuits 51 and 52 described later with reference to FIG. 7. Accordingly, even in a case in which the resistance values of the start pulse lines 62a and 62b are relatively high, the effect on display is small. On the other hand, the clock lines 61a to 61d are lines that are each related to control of a plurality of unit circuits 51a (e.g., for a certain clock line, half the number of unit circuits 51a included in one of the gate drive circuits 51 and 52), and accordingly the effect on display due to the resistance values of the clock lines 61a to 61d is large. Hence, relatively low resistance values are desirable for the clock lines 61a to 61d. With regard to this, according to the above-described configuration, the clock lines 61a to 61d and the clock terminals 72 are disposed at positions closer to the gate drive circuits 51 and 52 than the start pulse terminals 73, and accordingly the resistance values of the clock lines 61a to 61d can be reduced. As a result, potential fluctuation due to the resistance values of the clock lines 61a to 61d can be suppressed, and display quality of the display device 100 can be improved.

Some of the plurality of low-potential terminals 74 may be provided at positions that face the inter-element regions R4a in the Y2 direction and that are adjacent to the clock terminals 72. Another low-potential terminal 74 may be provided at a position that faces the inter-element region R4b in the Y2 direction and that is adjacent to the start pulse terminals 73. Here, the low-potential line 63 is a line relating to control of all unit circuits 51a included in the gate drive circuits 51 and 52, which will be described with reference to FIG. 7, and directly affects the off potential of the gate signal G. Accordingly, a low resistance value is desirable for the low-potential line 63, in order to suppress potential fluctuation due to the resistance value of the low-potential line 63. With regard to this, according to the above-described configuration, the low-potential line 63 and the low-potential terminals 74 are disposed at positions closer to the gate drive circuits 51 and 52 than the start pulse terminals 73, and accordingly the resistance value of the low-potential line 63 can be reduced. Further, the low-potential terminals 74 connected to the above low-potential line 63 are provided at positions adjacent to the start pulse terminals 73, and accordingly the resistance value of the low-potential line 63 can be reduced even further.

Also, according to the first embodiment, the plurality of gate connection lines 60 each pass through the inter-element regions R4a or R4b, and also pass through the mounting regions R3 in plan view. That is to say, the plurality of gate connection lines 60 are formed so as to pass beneath one of the source drive circuit elements 41 to 44 in the X1 direction or in the X2 direction. According to the above-described configuration, the width of the terminal region R1 in which the gate terminals 70 are disposed in the X1 direction and the X2 direction (width of the FPC 2) can be reduced as compared to a case in which the gate terminals are provided at positions facing a region further on the outer side from the plurality of source drive circuit elements, rather than at positions facing the inter-element regions R4a or R4b. As a result, the width of the FPC 2 can be reduced even in a case in which gate control signals and source control signals are supplied from the FPC 2 to the gate drive circuits 51 and 52, and the plurality of source drive circuit elements 41 to 44, on the display substrate 1. Reduction in the width of the FPC 2 enables improved freedom of design, such as forming a region of the display substrate 1 other than the portion that connects to the FPC 2 (i.e., the outer shape or frame) so as to have a shape such as an arc shape or the like.

Structure of Gate Connection Line

Figure 4:
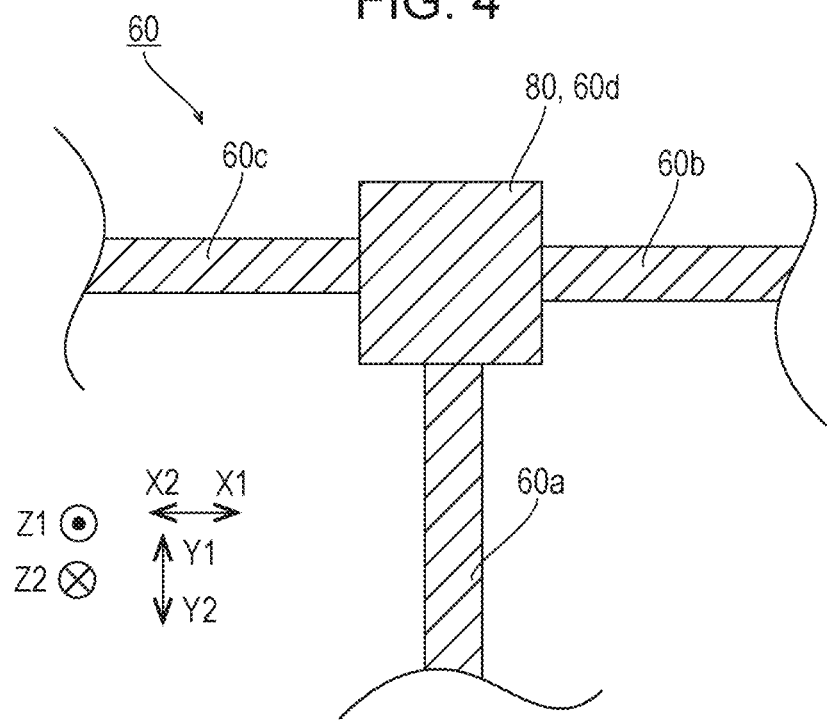
FIG. 4 is a plan view illustrating a configuration of a branched portion.

FIG. 4 is a plan view illustrating a configuration of a branched portion 60d of a gate connection line 60. The gate connection line 60 may include a terminal wiring portion 60a connected to the gate terminal 70, a first wiring portion 60b connected to the gate drive circuit 51, a second wiring portion 60c connected to the gate drive circuit 52, and the branched portion 60d, where the terminal wiring portion 60a branches into the first wiring portion 60b and the second wiring portion 60c. The terminal wiring portion 60a extends from the gate terminal 70 toward the branched portion 60d in a Y1 direction. The first wiring portion 60b extends from the branched portion 60d in the X1 direction. The second wiring portion 60c extends from the branched portion 60d in the X2 direction. According to this configuration, gate control signals to be supplied in common to the gate drive circuits 51 and 52 can be supplied to the gate drive circuits 51 and 52 using the first wiring portion 60b and the second wiring portion 60c branched from the terminal wiring portion 60a connected to the gate terminal 70. As a result, the number of gate terminals 70 can be reduced as compared to a case of providing different gate terminals for the gate drive circuits 51 and 52.

As illustrated in FIG. 2, the branched portions 60d of the plurality of gate connection lines 60 may each be disposed in the inter-element regions R4a or R4b. The branched portion 60d may include an inspection pad 80 exposed on the surface of the display substrate 1. The inspection pad 80 is a terminal with which a probe of an inspection device comes into contact during the manufacture of the display substrate 1. The inspection pad 80 is formed of the same material as the later-described pixel electrodes 11, and may be electrically connected to the gate connection line 60. Now, in a case of forming a gate terminal connected to an FPC as an inspection pad, the terminal (inspection pad) has to be formed so as to be large in size, so that the probe of the inspection device can easily come into contact with the inspection pad. Accordingly, the width of the region in which the terminal is disposed (the width of the flexible printed circuit board) becomes large in size. Conversely, according to the above-described configuration, the inspection pad 80 is formed at the branched portion 60d, and accordingly the width of the terminal region R1 in which the gate terminal 70 is disposed does not become large in the X1 direction and the X2 direction. As a result, the inspection pad 80 can be formed on the display substrate 1 while maintaining the width of the FPC 2 in the X1 direction and the X2 direction. The inspection pad 80 can be used to inspect the display substrate 1.

Figure 5:
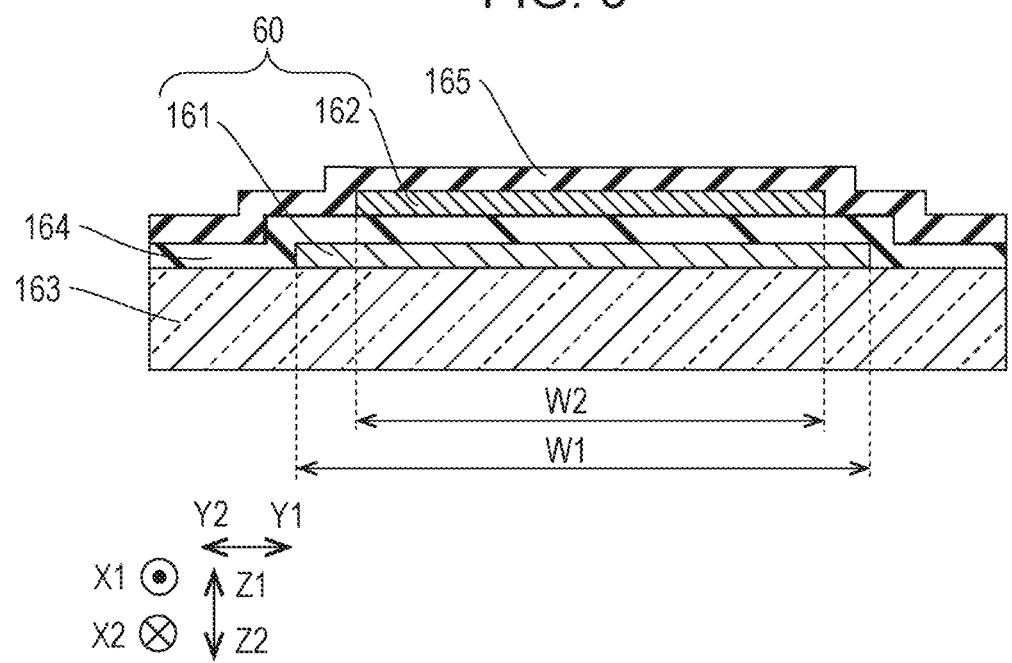
FIG. 5 is a cross-sectional view of a gate connection line.

FIG. 5 is a cross-sectional view of a gate connection line 60 taken along an XY plane thereof. As illustrated in FIG. 5, the gate connection line 60 includes a first layer 161 formed on a glass substrate 163, and a second layer 162 formed at an upper layer from the first layer 161. Specifically, the first layer 161 is formed in the same layer as the gate lines 14 and gate electrodes 12a of the thin-film transistors 12 (see FIG. 6) on the glass substrate 163. The first layer 161 is a metal film of copper (Cu), aluminum (Al), or the like, for example. Also, the first layer 161 is covered by an insulating layer 164. The second layer 162 is formed in the same layer as the source lines 13, and source electrodes 12b and drain electrodes 12c of the thin-film transistors 12 (see FIG. 6) on the insulating layer 164. The second layer 162 is a metal layer of copper (Cu), aluminum (Al), or the like, for example. Also, the second layer 162 is covered by an insulating layer 165. The insulating layers 164 and 165 are made of $SiN_x$ (silicon nitride) or $SiO_2$ (silicon dioxide), or a laminated film of these, for example.

Now, a width W1 of the first layer 161 in the Y1 and Y2 directions is larger than a width W2 of the second layer 162. The second layer does not have an eaves-like form, unlike in a case in which the width of the second layer is larger than the width of the first layer, and accordingly the coverage (film coverability) of the insulating layers 164 and 165 can be improved, and product reliability can be improved. Note that the present disclosure is not limited to the configuration in which the width W1 of the first layer 161 is larger than the width W2 of the second layer 162, and the width of the second layer may be larger than the width of the first layer. In this case, the resistance value of the gate connection line 60 can be reduced in accordance with the increase in width of the second layer. It is desirable that the width of the second layer be sufficiently larger than the width of the first layer and the stepped portion be gently sloped, so that the second layer does not have an eaves-like form, thereby enabling deterioration in coverage to be suppressed.

Thin-Film Transistor

Figure 6:
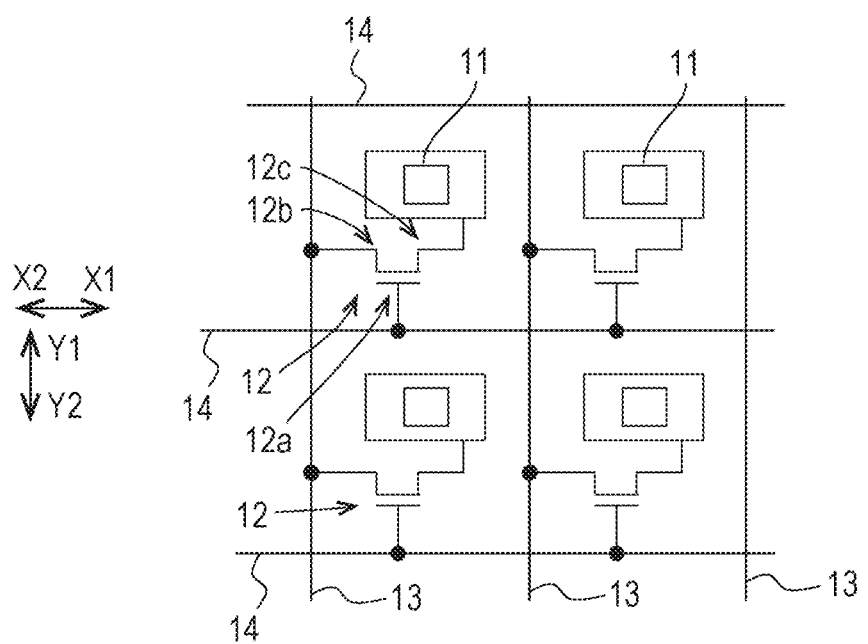
FIG. 6 is a diagram for describing a connection relation between pixel electrodes and thin-film transistors.

FIG. 6 is a diagram for describing a connection relation between the pixel electrodes 11 and the thin-film transistors 12. The plurality of source lines 13 extending in the Y1 direction and the plurality of gate lines 14 extending in the X1 direction or X2 direction are formed on the display substrate 1. The pixel electrodes 11 and the thin-film transistors 12 are disposed in regions sectioned by the plurality of source lines 13 and the plurality of gate lines 14. The thin-film transistors 12 include the gate electrodes 12a, the source electrodes 12b, and the drain electrodes 12c, as illustrated in FIG. 6. The gate electrodes 12a are connected to the gate lines 14. Also, the source electrodes 12b are formed in an upper layer from the gate electrodes 12a across the insulating layer 164 (see FIG. 5), and are connected to the source lines 13. The drain electrodes 12c are connected to the pixel electrodes 11 formed in an upper layer from the drain electrodes 12c across the insulating layer 165 (see FIG. 5). Also, a semiconductor layer (not illustrated) that is connected to the source electrodes 12b and the drain electrodes 12c is formed above the insulating layer 164 (see FIG. 5). When the gate signals G supplied to the thin-film transistors 12 transition to the on potential, source signals are written to the pixel electrodes 11. Accordingly, an electric field is generated between the pixel electrodes 11 and a common electrode that is not illustrated, the liquid crystal layer 1b sealed between the display substrate 1 and the counter substrate 1a is driven, and an image is displayed on the display substrate 1.

Configuration of Gate Drive Circuit

Figure 7:
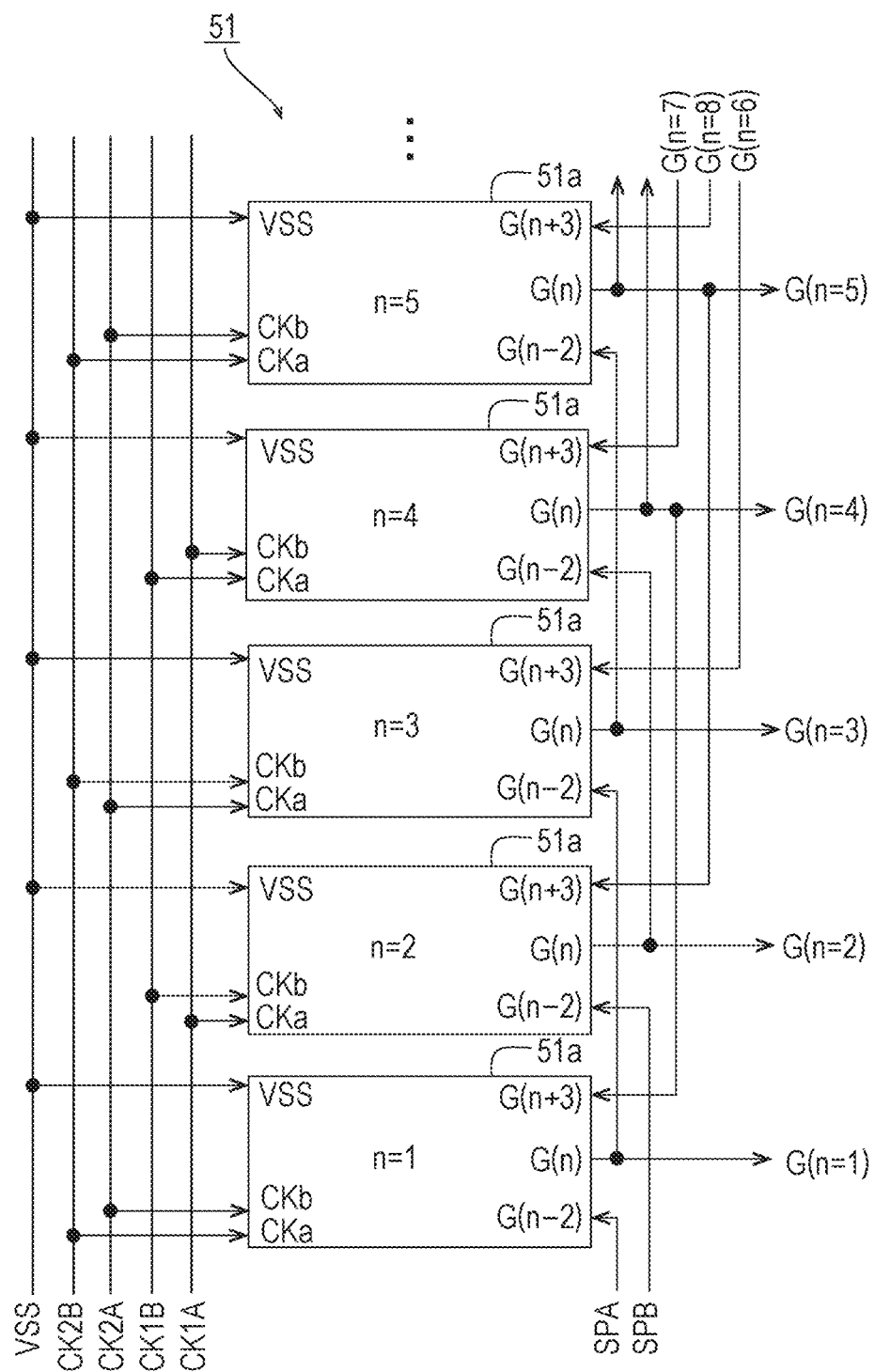
FIG. 7 is a diagram for describing a gate drive circuit.

FIG. 7 is a diagram for describing the gate drive circuit 51. Note that the gate drive circuit 52 has the same configuration as that of the gate drive circuit 51, and accordingly description will be omitted. As illustrated in FIG. 7, the gate drive circuit 51 includes unit circuits 51a provided for each gate line 14. In order to distinguish the plurality of unit circuits 51a here, the unit circuits 51a will be referred to as the first (natural number n=1) unit circuit 51a, the second (n=2) unit circuit 51a, . . . , and the n-th unit circuit 51a. The first (n=1) unit circuit 51a is connected to the first gate line 14, the start pulse line 62a, and the fourth gate line 14. The second (n=2) unit circuit 51a is connected to the second gate line 14, the start pulse line 62b, and the fifth gate line 14. In a case in which n is a natural number of 3 or greater, the n-th unit circuit 51a is connected to the n-th gate line 14, the (n−2)-th gate line 14, and the (n+3)-th gate line 14. Also, in a case in which n is an even number, the n-th unit circuit 51a is connected to the clock lines 61a and 61b, and the low-potential line 63. In a case in which n is an odd number, the n-th unit circuit 51a is connected to the clock lines 61c and 61d, and the low-potential line 63.

Figure 8:
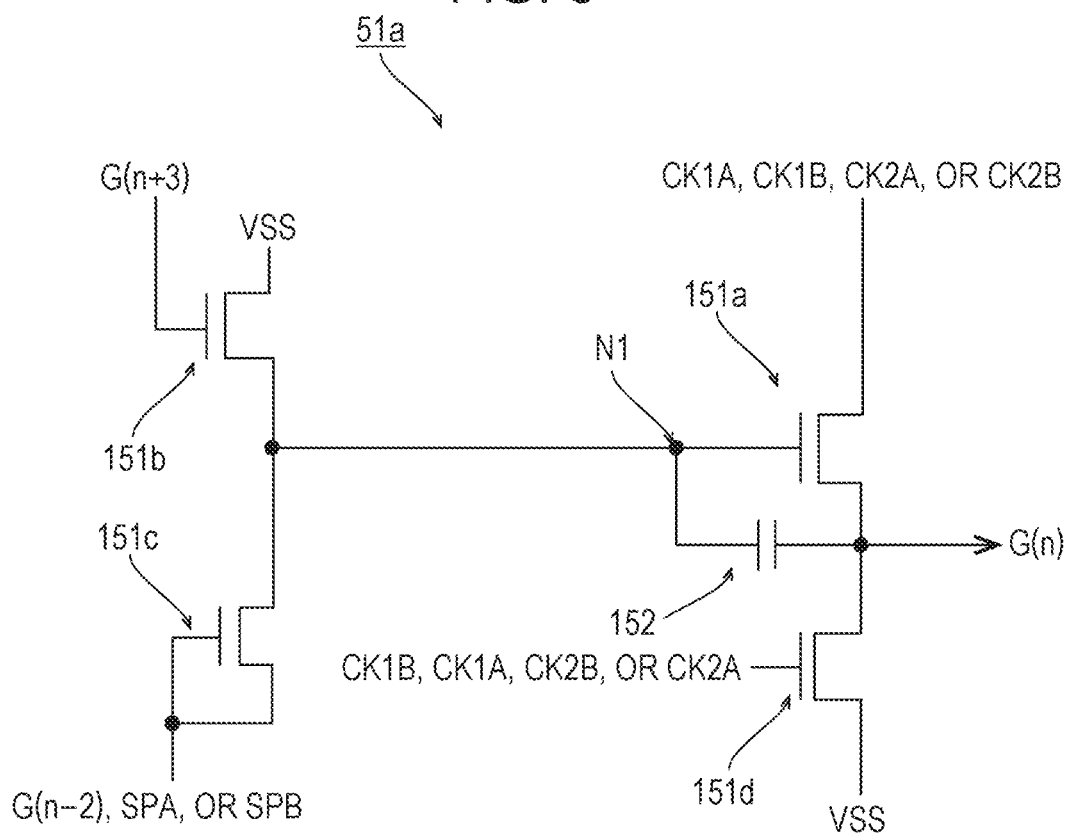
FIG. 8 is a circuit diagram for describing a unit circuit of the gate drive circuit.
Figure 9:
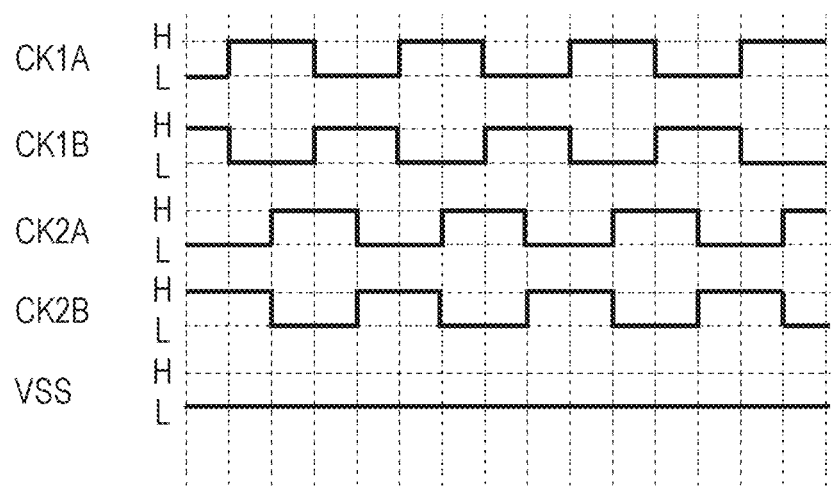
FIG. 9 is a timing chart of gate control signals.

FIG. 8 is a circuit diagram for describing the configuration of a unit circuit 51a. FIG. 9 is a timing chart of gate control signals. As illustrated in FIG. 8, the unit circuit 51a includes thin-film transistors 151a, 151b, 151c, and 151d, and a capacitor 152. The gate electrodes of the thin-film transistors 151a, 151b, 151c, and 151d and one electrode of the capacitor 152 are formed in the same layer as the gate lines 14 and the gate electrode 12a of the thin-film transistor 12.

Also, the source electrodes and drain electrodes of the thin-film transistors 151a, 151b, 151c, and 151d, and the other electrode of the capacitor 152 are formed in the same layer as the source lines 13 and the source electrode 12b and drain electrode 12c of the thin-film transistor 12. Further, the semiconductor layers of the thin-film transistors 151a, 151b, 151c, and 151d are formed in the same layer as the semiconductor layer of the thin-film transistor 12. That is to say, the thin-film transistors included in the unit circuit 51a can be manufactured by the same process as the thin-film transistors 12 in the display region R2, and accordingly there is no need to mount integrated circuit chips on the display substrate 1 as with the source drive circuit elements 41 to 44. The potential of the gate electrode (node N1) of the thin-film transistor 151a is controlled by the thin-film transistors 151b and 151c, and the capacitor 152, with the on or off potential for the gate signal G at the n-th gate line 14 being supplied via the thin-film transistor 151a, by the clock signals CK1A, CK1B, CK2A, and CK2B. Also, controlling the thin-film transistor 151d by the clock signals CK1A, CK1B, CK2A, and CK2B supplies the off potential for the gate signal G. Note that, as shown in FIG. 9, the clock signals CK2A and CK2B are out of phase with the clock signals CK1A and CK1B, respectively, by a quarter cycle.

Driving of the first unit circuit 51a is started by the start pulse signal SPA being supplied to the thin-film transistor 151c of the first unit circuit 51a. Driving of the second unit circuit 51a is started by the start pulse signal SPB being supplied to the thin-film transistor 151c of the second unit circuit 51a. In a case in which n is 3 or greater, driving of the n-th unit circuit 51a is started by a gate signal G (n−2) being supplied from the (n−2)-th unit circuit 51a to the thin-film transistor 151c of the n-th unit circuit 51a.

Thereafter, driving of the n-th unit circuit 51a is stopped by a gate signal G (n+3) being input from the (n+3)-th unit circuit 51a to the thin-film transistor 151b of the n-th unit circuit 51a. The above operation is repeated for each frame.

Configuration of Static Electricity Passage Portion

As illustrated in FIG. 3, static electricity passage portions 90 may be formed between the plurality of gate connection lines 60. A static electricity passage portion 90 is formed between the gate connection lines 60 and the common wiring 15. The static electricity passage portions 90 may be disposed in each mounting region R3 of the source drive circuit elements 41 to 44. In a case in which static electricity from the gate terminal 70 or the like enters one of two gate connection lines 60, the static electricity passage portion 90 functions to diffuse the static electricity to the other. Accordingly, the gate drive circuits 51 and 52 can be protected from static electricity. That is to say, the gate drive circuits 51 and 52 can be protected from damage. Also, the static electricity passage portions 90 are not connected to the source lines 13 and the gate lines 14 and do not transmit static electricity to the thin-film transistors 12, and accordingly the thin-film transistors 12 and the source drive circuit elements 41 to 44 can be protected from static electricity. That is to say, the thin-film transistors 12 and the source drive circuit elements 41 to 44 can be protected from damage.

Figure 10:
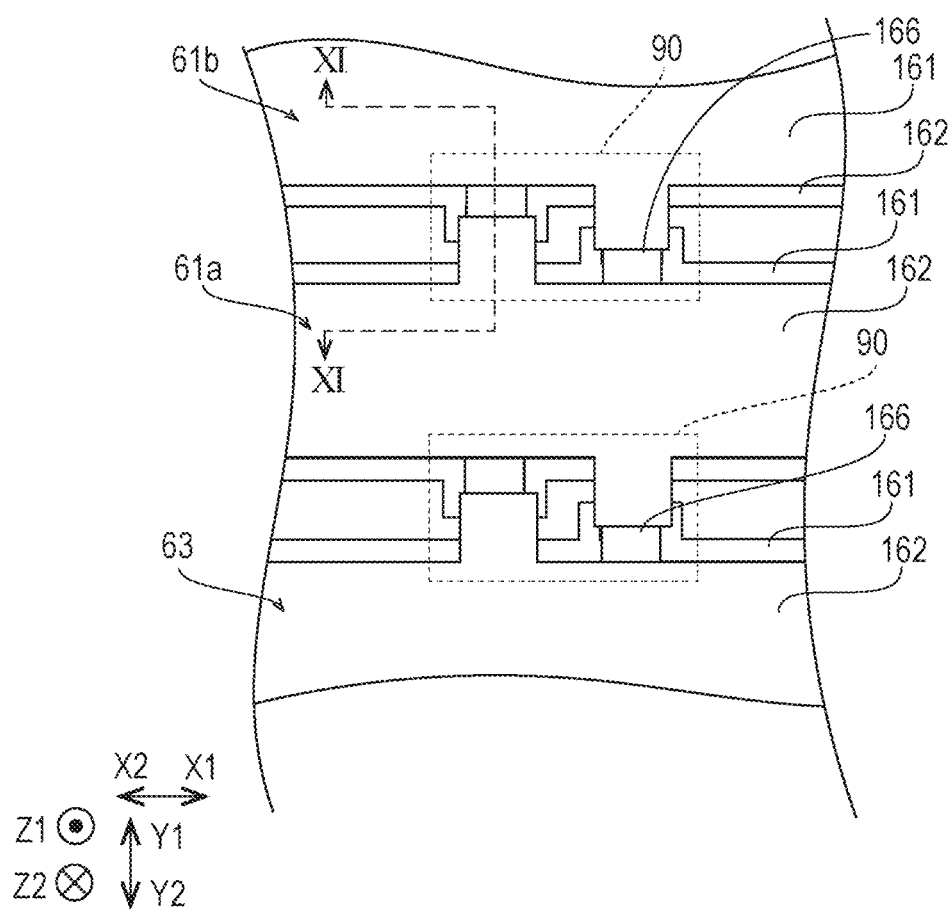
FIG. 10 is a plan view of static electricity passage portions.
Figure 11:
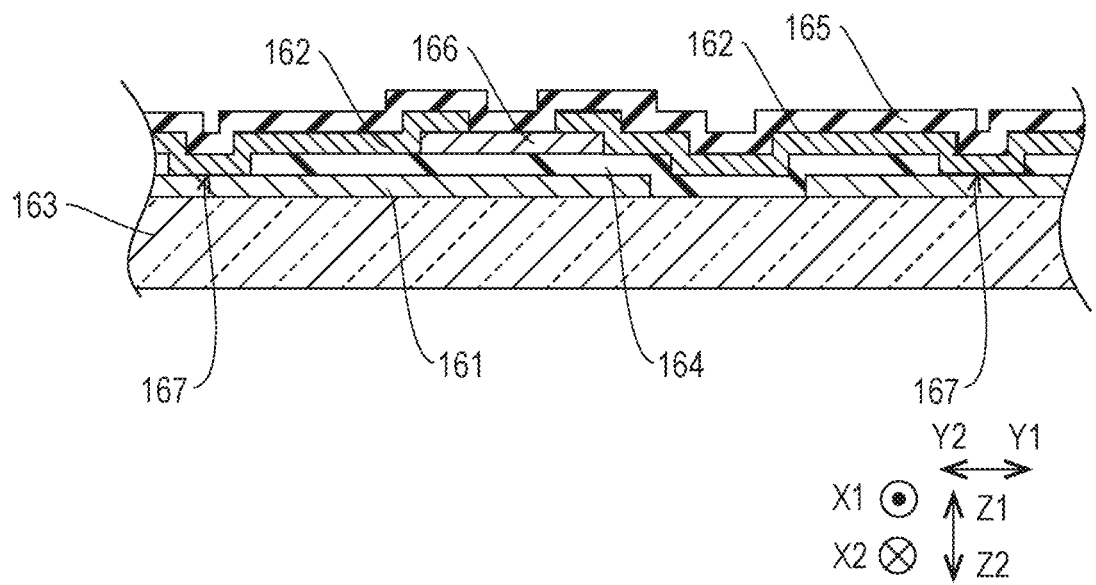
FIG. 11 is a cross-sectional view of a static electricity passage portion and an interlayer connecting portion.
Figure 12:
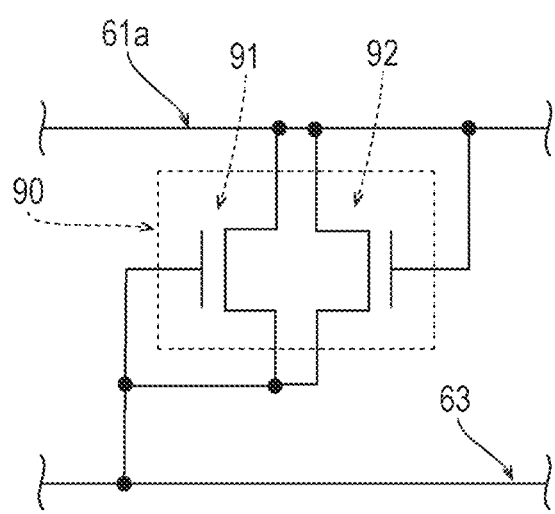
FIG. 12 is a circuit diagram of the static electricity passage portion.

FIG. 10 is a plan view of the static electricity passage portions 90. FIG. 11 is a cross-sectional view of the static electricity passage portions 90 and interlayer connecting portions 167 (cross-sectional view taken along line XI-XI in FIG. 10). FIG. 12 is a circuit diagram of a static electricity passage portion 90. As illustrated in FIG. 10, the static electricity passage portions 90 are configured as a diode ring including semiconductor layers 166. As illustrated in FIG. 12, the static electricity passage portion 90 includes a plurality of bottom-gate thin-film transistors 91 and 92, for example. In a case of static electricity entering the low-potential line 63, the thin-film transistor 91 turns on, and the static electricity is diffused to the clock line 61a. Also, in a case of static electricity entering the clock line 61a, the thin-film transistor 92 turns on, and the static electricity is diffused to the low-potential line 63.

As illustrated in FIG. 11, The static electricity passage portions 90 are composed of the first layer 161 that makes up the gate electrode of the thin-film transistor 91 or 92, the insulating layer 164 that covers the first layer 161, the semiconductor layer 166 formed upon the insulating layer 164, the second layer 162 that makes up the source electrode and drain electrode of the thin-film transistor 91 or 92, and the insulating layer 165 that covers the second layer 162. The semiconductor layer 166 is formed of an oxide semiconductor that includes indium (In), gallium (Ga), zinc (Zn), and oxygen (O), or amorphous silicon (Si). Now, in a case of light entering the semiconductor layer 166, the leak current increases, but in the first embodiment, the static electricity passage portions 90 may be formed within the mounting regions R3. Accordingly, the source drive circuit elements 41 to 44 can shield light heading toward the semiconductor layer 166, and accordingly the leak current of the static electricity passage portions 90 can be reduced without providing additional light-shielding members or the like. Also, there is no need to dispose the static electricity passage portions 90 in particular regions in which the light shielding film 1d is provided (e.g., regions of the counter substrate 1a in which the light shielding film 1d is provided). In a configuration in which the backlight 1e that emits light toward the display region R2 is provided in the Z1 direction as to the display substrate 1, i.e., on the side closer to the liquid crystal layer 1b and the counter substrate 1a than the display substrate 1, as in the display device 100 according to the first embodiment, this effect is particularly marked in configurations in which a viewer views the display from the opposite side of the display substrate 1 from the liquid crystal layer 1b, and in cases in which corners of the display substrate 1 in the Y2 direction are cut off (cases of corner cutting).

Interlayer connecting portions 167 are portions at which the first layer 161 and the second layer 162 are connected. In each mounting region R3, the interlayer connecting portions 167 are formed at both ends of the mounting region R3 (X1 direction and X2 direction), as illustrated in FIG. 3. Note that while FIG. 3 illustrates only the end portion of the mounting region R3 in the X2 direction, the interlayer connecting portions 167 are formed at the end portion in the X1 direction, as well. Also, the interlayer connecting portions 167 are provided to the gate connection lines 60.

Second Embodiment

Figure 13:
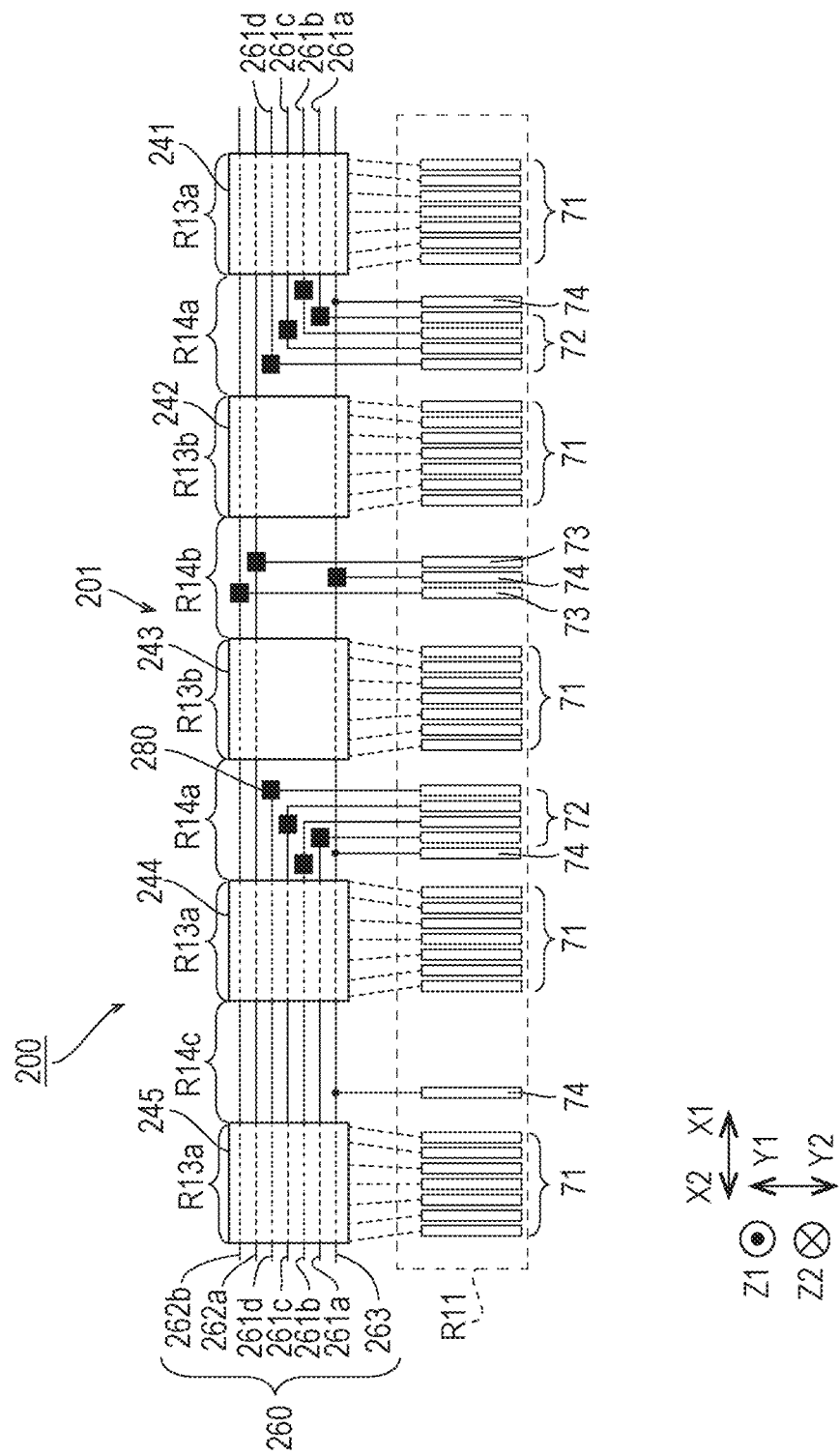
FIG. 13 is a diagram illustrating a configuration of a display device according to a second embodiment.

Next, a configuration of a display device 200 according to a second embodiment will be described with reference to FIGS. 13 and 14. Five source drive circuit elements (241 to 245) are included in the display device 200 according to the second embodiment. Note that in the following description, the same reference numerals as in the first embodiment indicate the same configurations as in the first embodiment, and the foregoing description will be referenced as long as there is no particular description. FIG. 13 is a diagram for describing the configuration of the display device 200 according to the second embodiment.

As illustrated in FIG. 13, the display device 200 according to the second embodiment includes a display substrate 201 and a plurality of gate connection lines 260. The plurality of gate connection lines 260 include clock lines 261a to 261d, start pulse lines 262a and 262b, and a low-potential line 263. Source drive circuit elements 241 to 245 are mounted on the display substrate 201. The source drive circuit elements 241 to 245 are arrayed at intervals in that order in the X2 direction. Regions of the display substrate 201 that overlap the source drive circuit elements 241, 244, and 245 in plan view are referred to as "mounting region R13a", and regions of the display substrate 201 that overlap the source drive circuit elements 242 and 243 in plan view are referred to as "mounting region R13b". The region between the source drive circuit elements 241 and 242, and the region between the source drive circuit elements 243 and 244 are each referred to as "inter-element region R14a". Also, the region between the source drive circuit elements 242 and 243 is referred to as "inter-element region R14b". Also, the region between the source drive circuit elements 244 and 245 is referred to as "inter-element region R14c".

In a terminal region R11, source terminals 71 are disposed at positions in the Y2 direction from the mounting regions R13a and R13b. Also, in the terminal region R11, the clock terminals 72 and the low-potential terminals 74 are disposed at positions in the Y2 direction from the inter-element regions R14a, the start pulse terminals 73 and the low-potential terminal 74 are disposed at a position in the Y2 direction from the inter-element region R14b, and the low-potential terminal 74 is disposed at a position in the Y2 direction from the inter-element region R14c. Also, inspection pads 280 are formed within the inter-element regions R14a and R14b.

Also, the clock lines 261a to 261d extending in the Y1 direction from the clock terminal 72 are bent in the X1 direction and extend in the shape of a letter L in plan view within the inter-element region R14a at the X1 direction side of the two inter-element regions R14a. The clock lines 261a to 261d extending in the Y1 direction from the clock terminal 72 are bent in the X2 direction and extend in the shape of a letter L in plan view within the inter-element region R14a at the X2 direction side of the two inter-element regions R14a. As illustrated in FIG. 13, the clock lines 261a to 261d do not pass through the mounting region R13b. The start pulse lines 262a and 262b pass through the mounting regions R13a and R13b.

Figure 14:
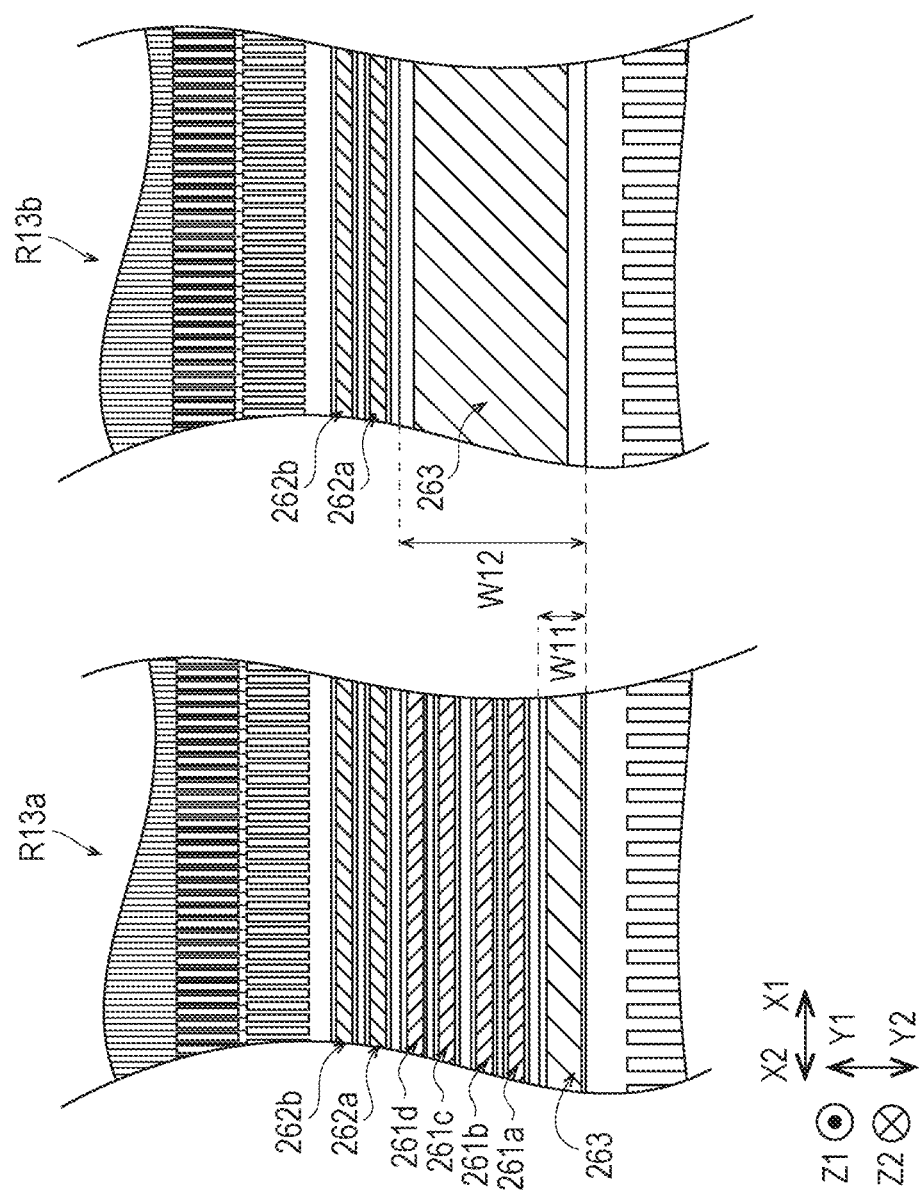
FIG. 14 is a diagram illustrating a configuration of a mounting region of the display device according to the second embodiment.

FIG. 14 is a diagram for describing the configurations of the mounting regions R13a and R13b. As illustrated in FIG. 14, the width of the low-potential line 263 in the Y1 direction is W11 in the mounting region R13a, and the width of the low-potential line 263 in the Y1 direction is W12, which is greater than W11, in the mounting region R13b. Accordingly, the width of the low-potential line 263 can be made larger in the mounting region R13b, and thus the resistance value of the low-potential line 263 can be made smaller, by which the potential fluctuation of the low-potential line 263 can be suppressed. Note that the other configurations and effects of the second embodiment are the same as the configurations and effects of the first embodiment.

Third Embodiment

Figure 15:
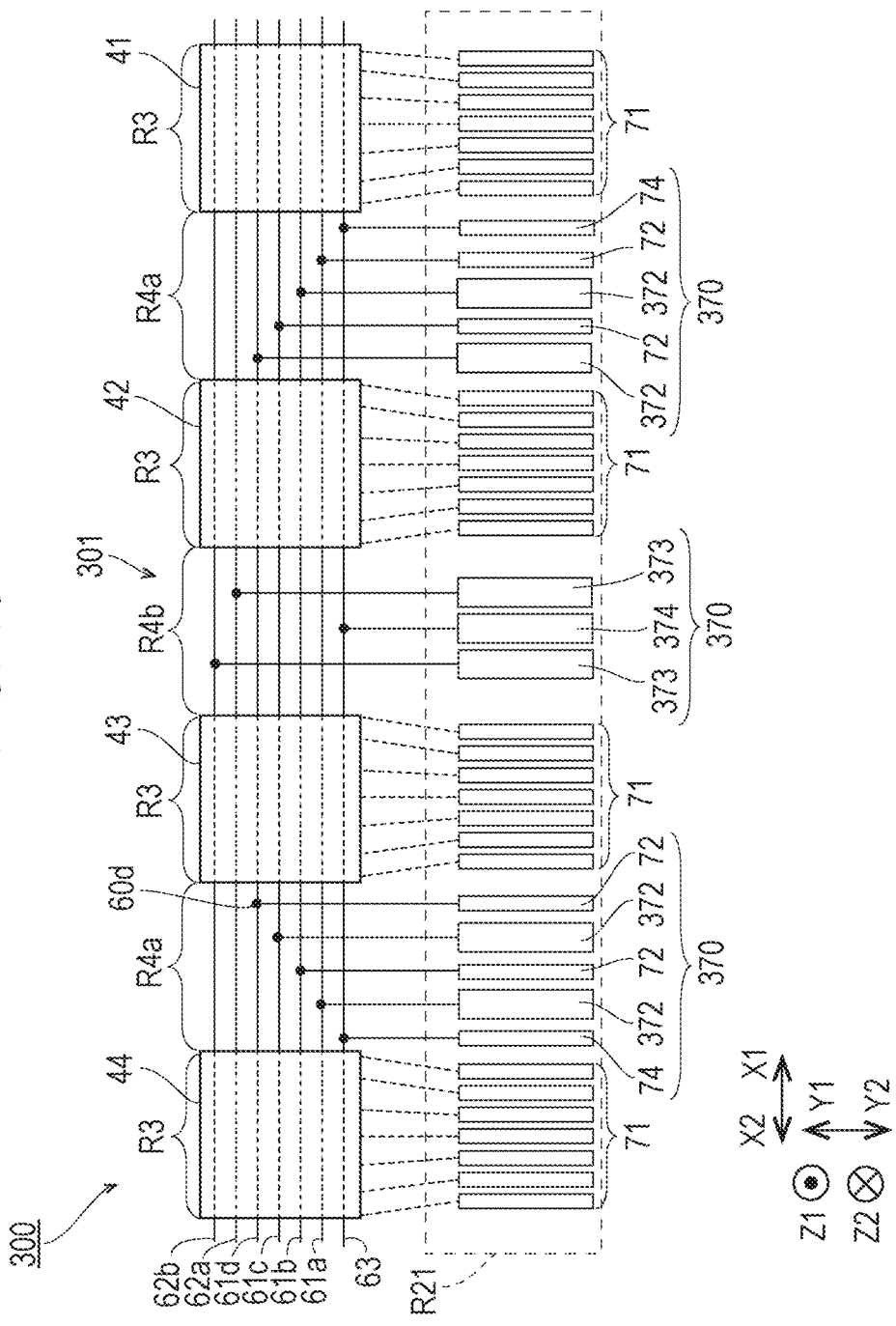
FIG. 15 is a diagram illustrating a configuration of a display device according to a third embodiment.

Next, a configuration of a display device 300 according to a third embodiment will be described with reference to FIG. 15. In the display device 300 according to the third embodiment, gate terminals 370 that function as inspection pads are disposed on a display substrate 301 in a terminal region R21. Note that in the following description, the same reference numerals as in the first or second embodiment indicate the same configurations as in the first or second embodiment, and the foregoing description will be referenced as long as there is no particular description. FIG. 15 is a diagram for describing the configuration of the display device 300 according to the third embodiment.

As illustrated in FIG. 15, the display device 300 according to the third embodiment includes the display substrate 301. The gate terminals 370 that function as inspection pads are formed on the display substrate 301 in the terminal region R21. Start pulse terminals 373 and a low-potential terminal 374 are provided at a position in the Y2 direction from the inter-element region R4b, for example. Also, clock terminals 372 are provided at positions in the Y2 direction from the inter-element regions R4a. The clock terminals 372, the start pulse terminals 373, and the low-potential terminal 374 each have a sufficient size to be individually touched by a probe of an inspection device that is not illustrated. That is to say, the areas of the clock terminals 372, the start pulse terminals 373, and the low-potential terminal 374 are larger than the areas of the clock terminals 72, the start pulse terminals 73, and the low-potential terminals 74, respectively, according to the first embodiment. Inspection of the gate connection lines can be easily performed by this configuration as well. Note that the other configurations and effects of the third embodiment are the same as the configurations and effects of the first embodiment.

Modifications

The embodiments described above are merely examples for carrying out the present disclosure. Accordingly, the present disclosure is not limited to the above-described embodiments, and the above-described embodiments can be carried out with appropriate modifications without departing from the spirit thereof.

(1) Although examples in which the number of source drive circuit elements is four or five have been described in the first to third embodiments, the present disclosure is not limited to this. For example, two, three, or six or more source drive circuit elements may be provided.

(2) Although examples in which all of the gate connection lines pass through the mounting regions in the X1 direction or in the X2 direction have been described in the first to third embodiments, the present disclosure is not limited to this. For example, some of the gate connection lines may be formed so as to circumvent the mounting regions.

(3) Although examples in which branched portions are provided to the gate connection lines have been described in the first to third embodiments, the present disclosure is not limited to this. For example, an arrangement may be made in which branched portions are not provided to the gate connection lines.

(4) Although an example in which inspection pads are provided to the branched portions, and an example in which gate terminals are configured to function as inspection pads, have been described in the first to third embodiments, the present disclosure is not limited to this. For example, in a case of forming a plurality of display substrates on a single piece of mother glass when manufacturing the display substrate, inspection pads may be formed on other substrates (so-called "sacrificed substrates") continuous with the display substrate. Also, even in cases in which the branched portions are not provided to the gate connection lines as in (3) above, inspection pads may be disposed in inter-element regions, and in a case in which branched portions are provided to the gate connection line, inspection pads may be disposed at positions other than the branched portions. Accordingly, inspection pads are configured in inter-element regions, and thus the width of the regions in which the terminals are disposed does not increase much.

(5) Although examples in which static electricity passage portions are provided in the mounting regions have been described in the first to third embodiments, the present disclosure is not limited to this. For example, an arrangement may be made in which no static electricity passage portions are provided, or in which static electricity passage portions are provided at positions other than the mounting regions.

(6) Although examples in which the common wiring extends in the Y2 direction as illustrated in FIG. 3 have been described in the first to third embodiments, the present disclosure is not limited to this. For example, common wiring may be formed extending in parallel with the gate connection lines.

Figure 16:
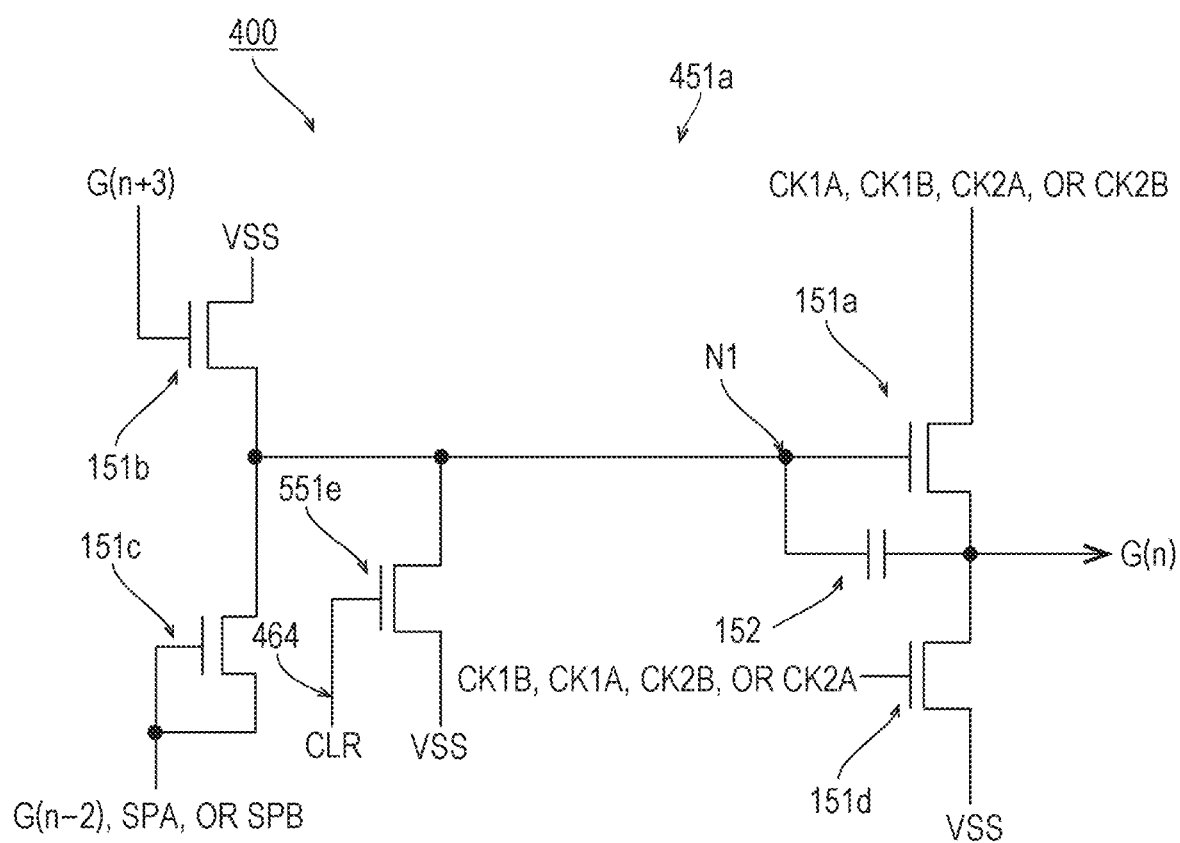
FIG. 16 is a diagram illustrating a configuration of a display device according to a modification of the first to third embodiments.

(7) Although examples in which the plurality of gate connection lines include clock lines, start pulse lines, and a low-potential line have been described in the first to third embodiments, the present disclosure is not limited to this. For example, a clear line 464 that transmits a clear signal CLR may be further included in the plurality of gate connection lines, as in a display device 400 according to a modification illustrated in FIG. 16. The "clear signal CLR" is a control signal that, at a particular cycle (e.g., in a period following output of the gate signals G from a unit circuit 451*a* at the final stage and before supply of the first start pulse signal SPA to the unit circuit at the initial stage), resets a particular node N1 of the unit circuit 451*a* to low potential via a thin-film transistor 551*e*. The frequency of the clear signal CLR being transmitted to the unit circuit 451*a* is smaller as compared to the clock signals CK1A, CK1B, CK2A, and CK2B, the start pulse signals SPA and SPB, and the low-potential signal VSS. Accordingly, the effect on display due to the resistance value of the clear line 464 is smaller as compared to the clock signals CK1A, CK1B, CK2A, and CK2B, the start pulse signals SPA and SPB, and the low-potential signal VSS. Hence, a terminal (clear terminal) connected to the clear line 464 may be disposed at a position in the Y2 direction from the inter-element regions R4*b* or R14*b*, in the terminal regions R1, R11, and R21. In FIG. 16, the same configurations as in FIG. 8 are denoted by the same reference numerals, and description is omitted.

(8) Although examples in which the backlight is provided on the side closer to the liquid crystal layer than the display substrate have been described in the first to third embodiments, the present disclosure is not limited to this. For example, the backlight may be provided on the side closer to the display substrate than the liquid crystal layer, or alternatively, a light guide panel may be additionally provided, with an edge light disposed on an edge portion of the light guide panel.

The display devices described above can be explained as follows.

A display device according to a first configuration includes a display substrate that has a display region in which a plurality of thin-film transistors are formed; a plurality of terminals that are formed on the display substrate and that are connected to a flexible printed circuit board; a plurality of source drive circuit elements that are mounted on the display substrate, that supply source signals to the plurality of thin-film transistors, and that are, at least in part, disposed between the display region and the plurality of terminals in plan view; a first gate drive circuit that is formed on the display substrate, and that supplies a gate signal to at least one of the plurality of thin-film transistors; and a plurality of connection lines that connect the plurality of terminals and the first gate drive circuit. At least one of the plurality of connection lines passes through an inter-element region that is a region between at least two of the plurality of source drive circuit elements in the display substrate in plan view, and at least one of the plurality of connection lines passes through a mounting region in which one of the plurality of source drive circuit elements is disposed on the display substrate. Of the plurality of terminals, a terminal connected to the connection line passing through the inter-element region is formed at a position facing the inter-element region in a direction from the inter-element region toward the flexible printed circuit board (first configuration).

According to the first configuration, a connection line connected to the first gate drive circuit passes through an inter-element region between adjacent source drive circuit elements, and a terminal to which this connection line connects is formed at a position facing this inter-element region. Accordingly, the width of the region in which the terminal is disposed (the width of the flexible printed circuit board) can be made smaller as compared to a case in which the terminal is disposed at a position facing a region further on the outer side than the plurality of source drive circuit elements, rather than at the position facing this inter-element region. As a result, even in a case in which control signals are supplied from the flexible printed circuit board to the gate drive circuit and the plurality of source drive circuit elements on the display substrate, the width of the flexible printed circuit board can be made smaller. Reduction in the width of the flexible printed circuit board enables improved freedom of design, such as forming a region of the display substrate other than the portion that connects to the flexible printed circuit board (i.e., the outer shape or frame) so as to have a shape such as an arc shape or the like.

The first configuration may further include a second gate drive circuit that supplies a gate signal to at least one of the plurality of thin-film transistors. The first gate drive circuit may be disposed at a portion of the display substrate further toward one side than the plurality of source drive circuit elements. The second gate drive circuit may be disposed at a portion of the display substrate further toward another side than the plurality of source drive circuit elements. At least one of the plurality of connection lines may include a terminal wiring portion connected to at least one of the plurality of terminals, a first wiring portion connected to the first gate drive circuit, a second wiring portion connected to the second gate drive circuit, and a branched portion where the terminal wiring portion branches into the first wiring portion and the second wiring portion. The branched portion may be disposed in the inter-element region (second configuration).

According to the second configuration, signals to be supplied in common to the first gate drive circuit and the second gate drive circuit can be supplied to the first gate drive circuit and the second gate drive circuit using the first wiring portion and the second wiring portion branched from the terminal wiring portion connected to the terminal. Consequently, the number of terminals can be reduced as compared to a case of providing different terminals for the first gate drive circuit and the second gate drive circuit. As a result, the width of the region in which the terminals are disposed (the width of the flexible printed circuit board) can be made even smaller.

In the second configuration, the branched portion may include an inspection pad exposed on a surface of the display substrate (third configuration). Also, the first or second configuration may further include an inspection pad connected to a connection line that passes through the inter-element region, and the inspection pad may be disposed in the inter-element region (fourth configuration).

Now, in a case of forming a terminal connected to a flexible printed circuit board as an inspection pad, the terminal (inspection pad) has to be formed so as to be large in size, so that a probe of the inspection device can easily come into contact with the inspection pad. Accordingly, the width of the region in which the terminal is disposed (the width of the flexible printed circuit board) becomes large in size. Conversely, according to the above third configuration, the inspection pad is formed at the branched portion, and accordingly the width of the region in which the terminal is disposed does not become large. Also, according to the fourth configuration, the inspection pad is formed in the inter-element region, and accordingly the width of the region in which the terminal is disposed does not become large. As a result, the inspection pad can be formed on the display substrate while maintaining the width of the flexible printed circuit board. The inspection pad can be used to inspect the display substrate.

In any one of the first to fourth configurations, at least two of the plurality of connection lines may pass through the mounting region. The display device may further include a static electricity passage portion that enables passage of static electricity between the at least two of the plurality of connection lines that pass through the mounting region. The static electricity passage portion may be disposed in the mounting region (fifth configuration).

According to the fifth configuration, static electricity entering from the terminal can be diffused between the two connection lines by the static electricity passage portion. As a result, a situation in which the static electricity reaches the thin-film transistors and damages the thin-film transistors can be avoided. Also, the static electricity passage portion is provided in the mounting region, and accordingly external light heading toward the static electricity passage portion can be shielded by the source drive circuit elements. As a result, leak current generated when the static electricity passage portion is irradiated with light can be made smaller.

In the fifth configuration, the display device may further include a counter substrate that faces the display substrate, a liquid crystal layer sealed between the display substrate and the counter substrate, and a backlight that emits light toward the display region. The backlight may be provided on a side closer to the liquid crystal layer than the display substrate (sixth configuration).

According to the sixth configuration, light heading toward the static electricity passage portion from the backlight can be shielded by the source drive circuit elements. As a result, leak current generated when the static electricity passage portion is irradiated with light can be made even smaller.

In any one of the first to sixth configurations, the plurality of terminals may include a plurality of source terminals formed at a position facing the mounting region in a direction from the mounting region toward the flexible printed circuit board. The display device may further include a source control signal line that connects the plurality of source terminals and the source drive circuit element disposed in the mounting region (seventh configuration).

According to the seventh configuration, the plurality of source terminals are disposed at positions facing the mounting regions, and accordingly variation in length of the source control signal lines connecting the plurality of source terminals and the source drive circuit elements can be reduced. As a result, difference in waveforms of signal rounding of the source control signals can be reduced, and accordingly display unevenness due to difference in waveforms of signal rounding can be reduced.

In the seventh configuration, three source drive circuit elements of the plurality of source drive circuit elements may be arrayed in a direction intersecting or orthogonal to a direction from the display region toward the flexible printed circuit board. A first inter-element region formed between a first source drive circuit element and a second source drive circuit element of the three source drive circuit elements, and a second inter-element region formed between the second source drive circuit element and a third source drive circuit element of the three source drive circuit elements, may be configured on the display substrate. The first inter-element region may be formed at a position closer to the first gate drive circuit than the second inter-element region. The plurality of connection lines may include a clock line and a start pulse line. The plurality of terminals may further include a start pulse terminal that is formed at a position facing the second inter-element region in a direction from the second inter-element region toward the flexible printed circuit board, and the start pulse line may be connected to the start pulse terminal (eighth configuration). Also, in the eighth configuration, the plurality of terminals may further include a clock terminal that is formed at a position facing the first inter-element region in a direction from the first inter-element region toward the flexible printed circuit board, and the clock line may be connected to the clock terminal (ninth configuration).

Now, the start pulse lines are lines that each supply control signals to, at the minimum, only one unit circuit included in the gate drive circuit. Accordingly, even in a case in which the resistance values of the start pulse lines are relatively high, the effect on display is small. On the other hand, the clock lines are lines that are related to control of a plurality (a large number) of unit circuits, and accordingly the effect on display due to the resistance values of the clock lines is large. Hence, relatively low resistance values are desirable for the clock lines. With regard to this, according to the above ninth configuration, the clock lines and the clock terminals are disposed at positions close to the first gate drive circuit, and accordingly the resistance values of the clock lines can be reduced. As a result, potential fluctuation due to the resistance values of the clock lines can be suppressed, and display quality can be improved.

In the ninth configuration, the plurality of connection lines may further include a low-potential line. The plurality of terminals may further include a plurality of low-potential terminals formed at a position that faces the first inter-element region and that is adjacent to the clock terminal and a position that faces the second inter-element region and that is adjacent to the start pulse terminal. The low-potential line may be connected to the plurality of low-potential terminals (tenth configuration).

Here, the low-potential line is a line relating to control of all unit circuits included in the gate drive circuit, and directly affects the off potential of the gate signal and so forth. Accordingly, a low resistance value for the low-potential line is desirable, in order to suppress potential fluctuation due to the resistance value of the low-potential line. With regard to this, according to the above tenth configuration, the low-potential line and the low-potential terminals are disposed at positions close to the first gate drive circuit, and accordingly the resistance value of the low-potential line can be reduced. Further, the low-potential terminals connected to the above low-potential line can be provided at positions adjacent to the start pulse terminal, and accordingly the resistance value of the low-potential line can be reduced even further.

In any one of the eighth to tenth configurations, the plurality of connection lines may further include a low-potential line. A width of a portion of the low-potential line passing through a mounting region in which the second source drive circuit element is disposed may be larger than a width of a portion of the low-potential line passing through a mounting region in which the first source drive circuit element is disposed (eleventh configuration).

According to the eleventh configuration, the width of the low-potential line can be made larger in the mounting region in which the second source drive circuit element is disposed, and thus the resistance value of the low-potential line can be made even smaller. As a result, the potential fluctuation of the low-potential line can be suppressed.

In any one of the first to eleventh configurations, the first gate drive circuit may include a plurality of gate-drive-circuit thin-film transistors. Materials forming gate electrodes, source electrodes, drain electrodes, and semiconductor layers of the plurality of gate-drive-circuit thin-film transistors may be the same as materials forming gate electrodes, source electrodes, drain electrodes, and semiconductor layers, respectively, of the plurality of thin-film transistors (twelfth configuration).

According to the twelfth configuration, the plurality of gate-drive-circuit thin-film transistors and the plurality of thin-film transistor can be manufactured by the same process, and accordingly there is no need for mounting thereof on the display substrate as with the source drive circuit elements.

The present disclosure contains subject matter related to that disclosed in Japanese Priority Patent Application JP 2021-065261 filed in the Japan Patent Office on Apr. 7, 2021, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A display device comprising:
a display substrate that has a display region in which a plurality of thin-film transistors are formed;
a plurality of terminals that are formed on the display substrate and that are connected to a flexible printed circuit board;
a plurality of source drive circuit elements that are mounted on the display substrate, that supply source signals to the plurality of thin-film transistors, and that are, at least in part, disposed between the display region and the plurality of terminals in plan view;
a first gate drive circuit that is formed on the display substrate, and that supplies a gate signal to at least one of the plurality of thin-film transistors; and
a plurality of connection lines that connect the plurality of terminals and the first gate drive circuit,
wherein at least one of the plurality of connection lines passes through an inter-element region that is a region between at least two of the plurality of source drive circuit elements in the display substrate in plan view, and at least one of the plurality of connection lines passes through a mounting region in which one of the plurality of source drive circuit elements is disposed on the display substrate, and of the plurality of terminals, a terminal connected to the connection line passing through the inter-element region is formed at a position facing the inter-element region in a direction from the inter-element region toward the flexible printed circuit board.

2. The display device according to claim 1, further comprising:
a second gate drive circuit that supplies a gate signal to at least one of the plurality of thin-film transistors,
wherein the first gate drive circuit is disposed at a portion of the display substrate further toward one side than the plurality of source drive circuit elements,
the second gate drive circuit is disposed at a portion of the display substrate further toward another side than the plurality of source drive circuit elements,
at least one of the plurality of connection lines includes a terminal wiring portion connected to at least one of the plurality of terminals, a first wiring portion connected to the first gate drive circuit, a second wiring portion connected to the second gate drive circuit, and a branched portion where the terminal wiring portion branches into the first wiring portion and the second wiring portion, and
the branched portion is disposed in the inter-element region.

3. The display device according to claim 2, wherein the branched portion includes an inspection pad exposed on a surface of the display substrate.

4. The display device according to claim 1, further comprising:
an inspection pad connected to a connection line that passes through the inter-element region, the inspection pad being disposed in the inter-element region.

5. The display device according to claim 1,
wherein at least two of the plurality of connection lines pass through the mounting region,
the display device further comprises a static electricity passage portion that enables passage of static electricity between the at least two of the plurality of connection lines that pass through the mounting region, and
the static electricity passage portion is disposed in the mounting region.

6. The display device according to claim 5, further comprising:
a counter substrate that faces the display substrate;
a liquid crystal layer sealed between the display substrate and the counter substrate; and
a backlight that emits light toward the display region,
wherein the backlight is provided on a side closer to the liquid crystal layer than the display substrate.

7. The display device according to claim 1,
wherein the plurality of terminals include a plurality of source terminals formed at a position facing the mounting region in a direction from the mounting region toward the flexible printed circuit board, and
the display device further comprises a source control signal line that connects the plurality of source terminals and the source drive circuit element disposed in the mounting region.

8. The display device according to claim 7,
wherein three source drive circuit elements of the plurality of source drive circuit elements are arrayed in a direction intersecting or orthogonal to a direction from the display region toward the flexible printed circuit board,
a first inter-element region formed between a first source drive circuit element and a second source drive circuit element of the three source drive circuit elements, and a second inter-element region formed between the second source drive circuit element and a third source drive circuit element of the three source drive circuit elements, are configured on the display substrate, the first inter-element region is formed at a position closer to the first gate drive circuit than the second inter-element region, the plurality of connection lines include a clock line and a start pulse line, and the plurality of terminals further include a start pulse terminal that is formed at a position facing the second inter-element region in a direction from the second inter-element region toward the flexible printed circuit board, the start pulse line being connected to the start pulse terminal.

9. The display device according to claim 8, wherein the plurality of terminals further include a clock terminal that is formed at a position facing the first inter-element region in a direction from the first inter-element region toward the flexible printed circuit board, the clock line being connected to the clock terminal.

10. The display device according to claim 9, wherein the plurality of connection lines further include a low-potential line, and the plurality of terminals further include a plurality of low-potential terminals formed at a position that faces the first inter-element region and that is adjacent to the clock terminal and a position that faces the second inter-element region and that is adjacent to the start pulse terminal, the low-potential line being connected to the plurality of low-potential terminals.

11. The display device according to claim 8, wherein the plurality of connection lines further include a low-potential line, and a width of a portion of the low-potential line passing through a mounting region in which the second source drive circuit element is disposed is larger than a width of a portion of the low-potential line passing through a mounting region in which the first source drive circuit element is disposed.

12. The display device according to claim 1, wherein the first gate drive circuit includes a plurality of gate-drive-circuit thin-film transistors, and materials forming gate electrodes, source electrodes, drain electrodes, and semiconductor layers of the plurality of gate-drive-circuit thin-film transistors are the same as materials forming gate electrodes, source electrodes, drain electrodes, and semiconductor layers, respectively, of the plurality of thin-film transistors.

\* \* \* \* \*